United States Patent [19]
Chun et al.

[11] Patent Number: 5,817,367
[45] Date of Patent: Oct. 6, 1998

[54] METHOD OF FORMING A THIN FILM OF COPPER

[75] Inventors: Soung Soon Chun; Chong Ook Park, both of Daejon; Dong Won Kim, Seoul; Won Jun Lee, Daejon; Sa Kyun Rha; Kyung Il Lee, both of Seoul, all of Rep. of Korea

[73] Assignee: LG Semicon., Ltd., Cheongju, Rep. of Korea

[21] Appl. No.: 772,290

[22] Filed: Dec. 23, 1996

[30] Foreign Application Priority Data

Dec. 29, 1995 [KR] Rep. of Korea ................ 1995-67319

[51] Int. Cl.[6] .................................................. C23C 16/18
[52] U.S. Cl. .................... 427/250; 427/255.7; 427/576; 427/528; 427/531
[58] Field of Search .................................. 427/250, 525, 427/528, 531, 576, 255.7

[56] References Cited

U.S. PATENT DOCUMENTS

| | | | |
|---|---|---|---|
| 5,096,737 | 3/1992 | Baum et al. | 427/250 |
| 5,098,516 | 3/1992 | Norman et al. | 427/250 |
| 5,221,416 | 6/1993 | Kishi et al. | 427/535 |
| 5,358,743 | 10/1994 | Hampden-Smith et al. | 427/250 |
| 5,395,642 | 3/1995 | Hamerich et al. | 427/576 |
| 5,441,766 | 8/1995 | Choi et al. | 427/250 |
| 5,534,314 | 7/1996 | Wadley et al. | 427/561 |

*Primary Examiner*—Shrive Beck
*Assistant Examiner*—Bret Chen
*Attorney, Agent, or Firm*—Fleshner & Kim

[57] ABSTRACT

A method of forming a thin film of copper on a substrate includes a first step of conducting a chemical vapor deposition (CVD) process using a metal organic (MO) source while applying a first bias voltage to the surface of the substrate and a second step of conducting a chemical vapor deposition process using a metal organic source while applying a second bias voltage to the substrate, wherein the second bias voltage is opposite in polarity to the first bias voltage. The process may include a third step of conducting a chemical vapor deposition process using a metal organic source while applying a third bias voltage to the substrate, where the third bias voltage has the same polarity as the first bias voltage.

9 Claims, 3 Drawing Sheets

METHOD OF FORMING A THIN FILM OF COPPER

BACKGROUND OF THE INVENTION

1. Field of the Invention

The present invention relates to a formation method for a Cu thin film using a bias voltage, and in particular, to an improved formation method for a bias-applied Cu thin film which is capable of increasing a grain size by changing a microstructure of a Cu growth film depending on the application of a bias voltage, and of improving a wiring characteristic by controlling an incubation time (which means a time required for one Cu monolayer to be applied on a substrate) required in depositing a Cu thin film.

2. Background of the Invention

A Cu thin film has been developed to be employed as a metal wiring material in very large scale integrated semiconductor devices. For forming the Cu thin film, a chemical vapor deposition (CVD) method is used by employing a metal organic (MO) source for allowing a deposition of a uniform thickness film despite various height differences on the semiconductor device surface and for allowing deposition to be carried out in low temperatures.

The MO sources used in the process are $Cu(II)$ ($\beta$-diketonate)2 which belongs to $Cu(II)$ chemical compounds and a cyclopentadiene $Cu(I)$ trialkylphosphine, $Cu(I)$t-butoxide tetramered and Lewis-base stabilized $Cu(I)$ $\beta$-diketonate which belong to $Cu(I)$ chemical compounds.

Especially, since the $Cu(II)$ compounds usually remain in a liquid state at room temperature, when using a bubbler or a liquid delivery system the inside of a reaction chamber is arranged to be under a pressure of 0.1 torr to 2 torr and a temperature of 140° C. to 400° C., and a Cu thin film is deposited by CVD by supplying an MO source to the inside of the reaction chamber.

When the above method is used, depending on a surface condition of the substrate on which a Cu thin film is to be deposited, an incubation time of 1 to 10 minutes is required. To control this time, a Cu thin film is deposited on the substrate through a sputtering method, and then is further formed by a CVD method. That is, a double deposition process must be performed.

Generally, in the case of a CVD Cu thin film formed by using an MO source, the grain size after the completion of the deposition process is smaller than a deposition thickness, and therefore, the resistivity of the deposited Cu thin film is no more than 2 $\mu\Omega$'cm, a bulk resistivity: 1.67 $\mu\Omega$'cm).

On the other hand, when the grain size reaches the thickness of the Cu thin film, the surface of the deposited Cu thin film becomes rough, resulting in lowering the electromigration characteristic and causing much difficulty in an etching process.

That is, as described above, when a Cu thin film is deposited according to the conventional art, disadvantages occur as follows:

Since the grain size of the Cu thin film is smaller than the deposition thickness, it is difficult to reduce the resistivity value of the thin film which is easily influenced by the microstructure, to 2 $\mu\Omega$' cm, and when the grain size of the Cu thin film reaches the thickness of the Cu thin film, the surface of the thin film becomes rough, resulting in lowering electromigration and causing difficulties in performing an etching process. Further, the necessity of an incubation time according to the characteristic of the substrate, impacts upon throughput, and to control the incubation time, such a complicated process as a double deposition is required.

SUMMARY OF THE INVENTION

Accordingly, it is an object of the present invention to provide a formation method for a Cu thin film using a bias voltage which is capable of increasing grain size and controlling an incubation time required in an initial stage of the thin film growth. The process uses a change in the microstructure of a Cu growth film in accordance with the application of a bias voltage to secure a better wiring characteristic in forming a thin film appropriate to a wiring material for high integration DRAM devices of more than 256M.

To achieve the above object, there is provided an improved formation method for a bias voltage-applied Cu thin film according to the present invention in which a Cu thin film is formed by a chemical vapor deposition (CVD), using an MO source, while applying a bias voltage to the surface of a substrate.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

With reference to the accompanying drawings, methods of forming a bias voltage-applied Cu thin film will now be described in detail.

According to the present invention, an increase in grain size can be achieved by employing a change in the microstructure of a Cu growth film in accordance with the application of a bias voltage, and a better wiring characteristic can be obtained by reducing an incubation time required in an initial growth stage of a Cu thin film.

Now, the theoretical background, the experimental result and the formation method will be described in detail.

First, the theoretical background will be explained.

Cu(HFAC) compounds are used as an MO source for a Cu thin film obtained by using a CVD method, considering such characteristics as the physical condition, the vapor pressure, the deposition temperature and thermal stability. According to the report "P. Dopelt, MRS Bulletin, August 1994, p41", each Cu(HFAC) compound has a different characteristic depending on the ligand coordinating with the compound. Table 1 shows the kinds of Cu(I)(HFAC) compounds.

TABLE 1

LIGANDS AND LEWIS BASES

| *R,R' | LIGAND | *ABBR |
|---|---|---|
| R=R'=CH | ACETYIACETONE | ACAD |
| R=CH R'=CF | 1,1,1-TRIFLUORO-2 4-PENTANEDIONE | TFAC |
| R=F'=CF | 1,1,1,5,5,5,-HEXAFLUORO-2 4-PENTANEDIONE | HFAC |
| R=CF R'=CF | 1,1,1,5,5,5,6,6,7,7,7,-DECAFLUORO-2, 4-HEPTANEDIONE | DRHD |
| R=R'=CF | 1,1,1,2,2,3,3,7,7,8,8,9,9,-TETRADECAFLUORO-4, 6-NONANEDIONE | TDF |

| LEWIS BASE(L) | *ABBR |
|---|---|
| VINYLTRIMETHYISILANE | VTMS |
| BIS(TRIMETHYLSILYL)ACETYLENE | BTMSA |
| 1,5-CYCLOOCTADIENE | COD |
| 1,5-DIMETHLY-1,5-CYCLOOCTADIENE | 1,5-DMCOD |
| 1,6-DIMETHLYL-1,5CYCLOOCTADIENE | 1,6-DMCOD |
| DIMETHLYL-1,5CYCOLLCTADIENE | DMCOD |

*ABBR: abbreviated form of ligands
*R,R': radical

The reaction steps of the Cu(HFAC) compounds have been studied by G. S. Girolamiet al, and the procedures include the following six steps, as reported in "Journal of American Chemical Society" 115(1993) 1015. Here, the case when a Cu thin film is deposited by using a $Cu^{+1}$ (HFAC) (VTMS) MO source will be explained, for example.

Figure 1:
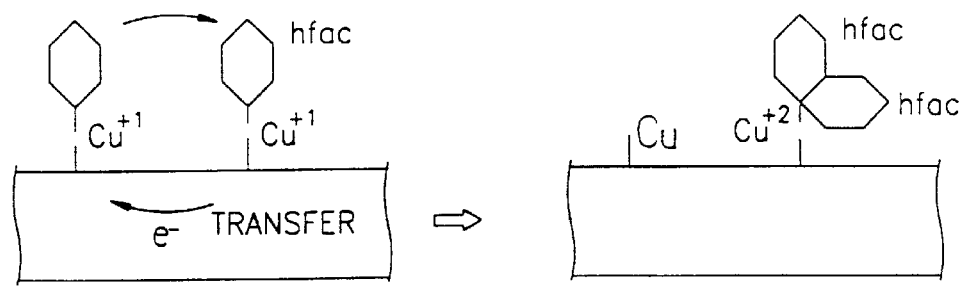
FIG. 1 is a view showing that $(HFAC)_+$ is separated from $Cu_+(HFAC)$ and Cu alone is deposited on a substrate according to the present invention.

First step: $2Cu^{+1}(HFAC)\ (VTMS)\ (g) \rightarrow 2Cu^{+1}(HFAC)\ (VTMS)\ (s)$ Second step: $2Cu^{+1}(HFAC)\ (s) \rightarrow 2Cu^{+1}(HFAC)\ (VTMS)\ (s) + 2VTMS(s)$ Third step: $2VTMS(s) \rightarrow 2VTMS(g)$ Fourth step: $2Cu^{+1}(HFAC)\ (s) \rightarrow Cu^0(HFAC)\ (s) + Cu^{+2}(HFAC)\ (s)$ Fifth step: $Cu^0(HFAC)\ (s) + Cu^{+2}(HFAC)\ (s) \rightarrow Cu^0(s) + Cu^{+2}(HFAC)_2(s)$ Sixth step: $Cu^{+2}(HFAC)_2(s) \rightarrow + Cu^{+2}(HFAC)_2(g)$ Here, when an e- transfer is carried out in the fifth step, as shown in FIG. 1, $(HFAC)^+$ is separated from $Cu^+(HFAC)$ (s) and only Cu is deposited on the substrate 10.

That is, when electrons are filled on the substrate 10 or the substrate 10 has an excellent electrical conductivity, the above-described steps proceed rapidly in an initial deposition, resulting in increasing the deposition speed of a Cu thin film. This accounts for the change of the substrate; that is, a large difference in the deposition rate of a thin film on an oxide film and a metal, and using the above-mentioned change, a selective deposition can be done.

Therefore, if a bias is initially applied to the substrate in the course of the deposition of a Cu thin film by a CVD method, it can result in accelerating or controlling the formation of a Cu nucleation site, and after the deposition of one layer, the effects of the above-mentioned difference are reduced.

Next, a description of the change in the microstructure will be given through an experiment when a Cu thin film is formed by a CVD method under the condition that a bias voltage is applied to a substance.

Figure 2:
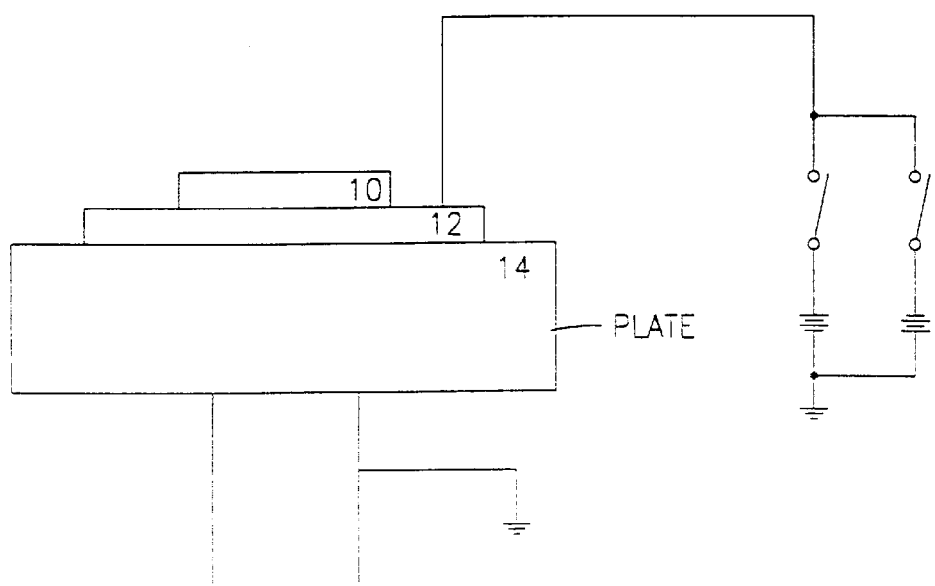
FIG. 2 is a view showing the formation of a Cu thin film to which a bias voltage is applied according to the present invention.

As shown in FIG. 2, (+) bias voltage and (-) bias voltage are applied to the surface of the substrate 10 on which a Cu thin film is to be deposited, and the experiment is conducted under the condition that the substrate 10 is insulated from the plate 14 by using a test piece 12 composed of a material for an insulating film to prevent the electrical current from flowing through the substrate 10 and the plate 14. Here, the applied bias voltage can be changed to (+) voltage and (-) voltage, and each voltage can be variable.

This experiment was conducted while varying the bias voltage between (+) or (-) and varying the magnitude of the bias voltage.

As a result, there was little difference observed due to the magnitude of each voltage, but a large difference was observed between applying the (+) and (-) voltages. Further, a large difference resulted from the deposition condition.

Table 2 shows the change in the microstructure of a Cu thin film when the CVD Cu thin film is deposited to have a thickness of 4000 Å under a pressure of 0.5 torr and at a temperature of 180° C.

TABLE 2

| A | B | C | D | E | F |
|---|---|---|---|---|---|
| temp; 180° C. | 0 bias | 4' 30" | 2050 Å | rough | 16:6% |
| pre; 0.5 torr | +30 V bias | 8' 20" | 3720 Å | rough | 16:4% |
| thick; 4000 Å | -30 V bias | 20" | 1270 Å | smooth | 16:3% |

Figure 4A:
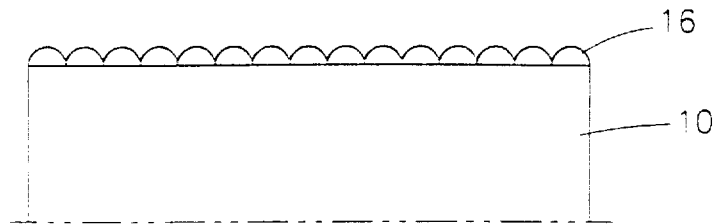
FIGS. 4A, 4B and 4C are views showing a formation of a Cu thin film through a three-step process according to the present invention.
Figure 4B:
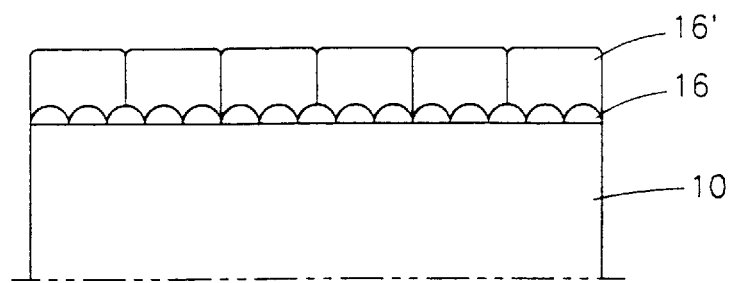
Figure 4C:
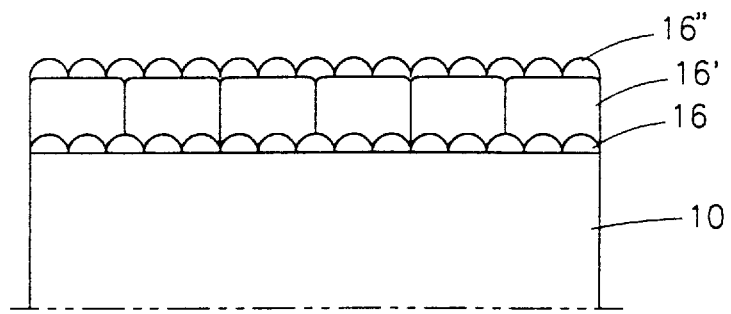

A: deposition condition
B: bias
C: incubation time
D: grain size
E: surface roughness
F: thickness uniformity
temp: temperature
pre: pressure
thick: thickness Next, a preferred formation method for improving the characteristics of a Cu thin film by using the change in the microstructure of the Cu thin film in accordance with the application of a bias voltage, as shown in FIGS. 4A through 4C, will be described.

The method is based on the formation of a Cu thin film, using an MO source, while applying a bias voltage to the surface of the substrate 10. The MO sources used here are Cu(II)(β-diketonate)2 which belongs to Cu(II) chemical compounds and a cyclopentadiene Cu(I) trialkylphospine, Cu(I)t-butoxide tetramered and Lewis-base stabilized Cu(I) β-diketonate which belong to Cu(I) chemical compounds, and other MO Cu compounds.

Figure 3A:
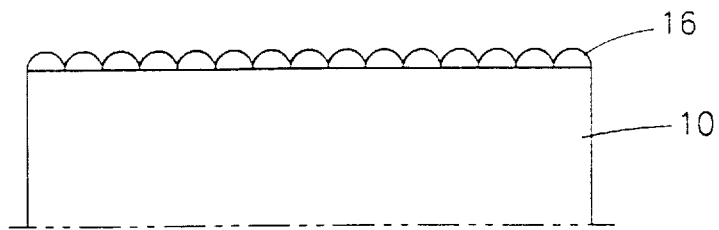
FIGS. 3A and 3B are views showing the formation of a Cu thin film through a two-step process according to the present invention.
Figure 3B:
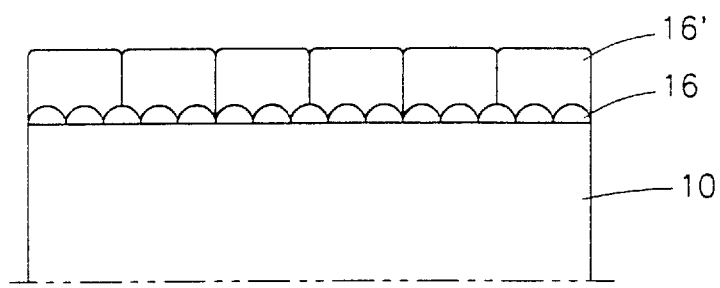

There are two methods for forming a Cu thin film as shown in FIGS. 3A and 3B, and in FIGS. 4A through 4C.

First, as shown in FIG. 3A, when (-) bias voltage is applied to the surface of the substrate 10, a first Cu thin film 16 is formed by a CVD method to have a thickness of less than 50% of an entire Cu thin film to be obtained.

Second, as shown in FIG. 3B, when (+) bias voltage is applied to the surface of the substrate 10, a second Cu thin film 16' is formed by a CVD method to have a thickness of more than 50% of an entire Cu thin film to be obtained on the first Cu thin film 16.

In the method shown in FIGS. 4A through 4B, since the first two steps are identical to FIGS. 3A and 3B, the description will be omitted, and a next third step will be explained.

Third, as shown in FIG. 4C, (-) bias voltage is applied again to the surface of the substrate 10, and a third Cu thin film 16" is formed on the second Cu thin film 16' by a CVD method.

The total thickness of the first and third Cu thin films 16,16" is formed by a CVD method to have a thickness of less than 50% of the entire Cu thin film to be obtained, and the thickness of the second Cu thin film 16' is formed to have a thickness of more than 50% of the entire Cu thin film to be obtained.

As the above process is carried out, an increase in the grain size obtained by the application of (+) bias voltage and the controlling of an incubation time and an enhanced thickness uniformity achieved by the application of (−) bias voltage result in an improvement in a wiring characteristic.

As described in detail above, the present invention has the advantages as follows:

Since the resistivity value of a Cu thin film can be lowered to less than $2 \mu\Omega$'cm, the operation speed of a semiconductor device can be made faster, and an increase in a grain size can enhance the electromigration characteristic. In addition, since the incubation time required in an initial deposition of a Cu thin film can be controlled, the throughput can be improved.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A method of forming a thin film of copper, comprising the steps of:
    forming a first portion of the thin film of copper on a substrate by a chemical vapor deposition process using a metal organic source while applying a negative bias voltage to the substrate; and
    forming a second portion of the thin film of copper on the substrate by a chemical vapor deposition process using a metal organic source while applying a positive bias voltage to the substrate.

2. The method of claim 1, wherein the metal organic source is selected from the group consisting of Cu(II) (β-diketonate)2, cyclopentadiene Cu(I) trialkylphosphine, Cu(I) t-butoxide tetramered and Lewis-base stabilized Cu(I) β-diketonate.

3. The method of claim 1, wherein a thickness of the first portion of the thin film of copper is less than 50% of a final thickness of the thin film of copper.

4. The method of claim 1, further comprising the step of forming a third portion of the thin film of copper on the substrate by a chemical vapor deposition process using a metal organic source while applying negative bias voltage.

5. The method of claim 4, wherein a combined thickness of the first and third portions of the thin film of copper is less than 50% of a thickness of the second portion of the thin film of copper.

6. The method of claim 1, wherein the second portion and the first portion of the thin film of copper have different grain sizes.

7. The method of claim 1, wherein the second portion and the first portion of the thin film of copper have different electromigration characteristics.

8. A method of forming a thin film of copper, comprising the steps of:
    forming a first portion of the thin film of copper on a substrate by a deposition process while applying a first bias voltage to the substrate; and
    forming a second portion of the thin film of copper on the substrate by a deposition process while applying a second bias voltage to the substrate, wherein the second bias voltage has a polarity opposite to the first bias voltage, wherein a thickness of the first portion of the thin film of copper is less than 50% of a final thickness of the thin film of copper and wherein a rate of deposition is increased by the second bias voltage.

9. A method of forming a thin film of copper, comprising the steps of:
    forming a first portion of the thin film of copper on a substrate by a chemical vapor deposition process while applying a first bias voltage to the substrate; and
    forming a second portion of the thin film of copper on the substrate by a chemical vapor deposition process while applying a second bias voltage to the substrate, wherein the second bias voltage has a polarity opposite to the first bias voltage, wherein the second portion and the first portion of the thin film of copper have different grain sizes and wherein a rate of deposition is increased by the second bias voltage.

\* \* \* \* \*

UNITED STATES PATENT AND TRADEMARK OFFICE
CERTIFICATE OF CORRECTION

PATENT NO. : 5,817,367
DATED : October 6, 1998
INVENTOR(S) : CHUN, et al.

It is certified that error appears in the above-identified patent and that said Letters Patent is hereby corrected as shown below:

On the title page,

[75] Assignee's name from "LG Semicon., Ltd." to --LG Semicon Co., Ltd.--

Signed and Sealed this

Twentieth Day of July, 1999

Attest:

Attesting Officer

Q. TODD DICKINSON

Acting Commissioner of Patents and Trademarks